United States Patent [19]
Hamzehdoost

[11] Patent Number: 5,999,415
[45] Date of Patent: Dec. 7, 1999

[54] BGA PACKAGE USING PCB AND TAPE IN A DIE-DOWN CONFIGURATION

[75] Inventor: Ahmad Hamzehdoost, Sacramento, Calif.

[73] Assignee: VLSI Technology, Inc., San Jose, Calif.

[21] Appl. No.: 09/195,351

[22] Filed: Nov. 18, 1998

[51] Int. Cl.[6] .................................. H05K 1/11; H05K 7/20
[52] U.S. Cl. .......................... 361/803; 361/718; 361/720; 361/749; 361/764; 361/767; 257/703; 257/707; 257/738; 257/778; 257/784; 438/122
[58] Field of Search .................................. 361/718–720, 361/749, 761, 764, 767, 768, 770, 771, 784, 803; 257/668, 688, 700, 701, 680, 703, 706, 707, 713, 717, 737, 738, 778, 784; 439/66, 67, 77, 591; 438/122; 174/262

[56] References Cited

U.S. PATENT DOCUMENTS

| | | | |
|---|---|---|---|
| 5,477,082 | 12/1995 | Buckley, III et al. | 257/778 |
| 5,583,378 | 12/1996 | Marrs et al. | 257/710 |
| 5,659,952 | 8/1997 | Kovac et al. | 257/668 |
| 5,729,051 | 3/1998 | Nakamura | 257/738 |
| 5,814,883 | 9/1998 | Sawai et al. | 257/738 |
| 5,834,839 | 11/1998 | Mertol | 257/707 |

*Primary Examiner*—Leo P. Picard
*Assistant Examiner*—John B. Vigushin
*Attorney, Agent, or Firm*—Patrick T. King

[57] ABSTRACT

A die-down HBGA package includes an integrated-circuit die mounted to a substantially flat lower surface of a die-carrier/heat spreader. A flexible insulated tape layer with a central opening for the die has its upper surface adhesively fixed to the lower side of the die-carrier/heat spreader. Wire-bonding sites and a number of contact areas are connected by traces on the lower surface of the tape layer. Bonding-wire loops are connected between the wire-bonding pads on the die and the wire-bonding sites on the insulated tape layer. A rigid board, such as an epoxy or ceramic circuit board, with electrically conductive plated-through holes is fixed to the insulated flexible tape layer with adhesive. Conductive adhesive material connects the contact areas with the top surfaces of the plated-through holes. Alternatively, pins join the carrier/heat spreader and the rigid circuit board. Solder pads for solder balls are formed on the bottom surface of the printed-circuit board.

18 Claims, 2 Drawing Sheets

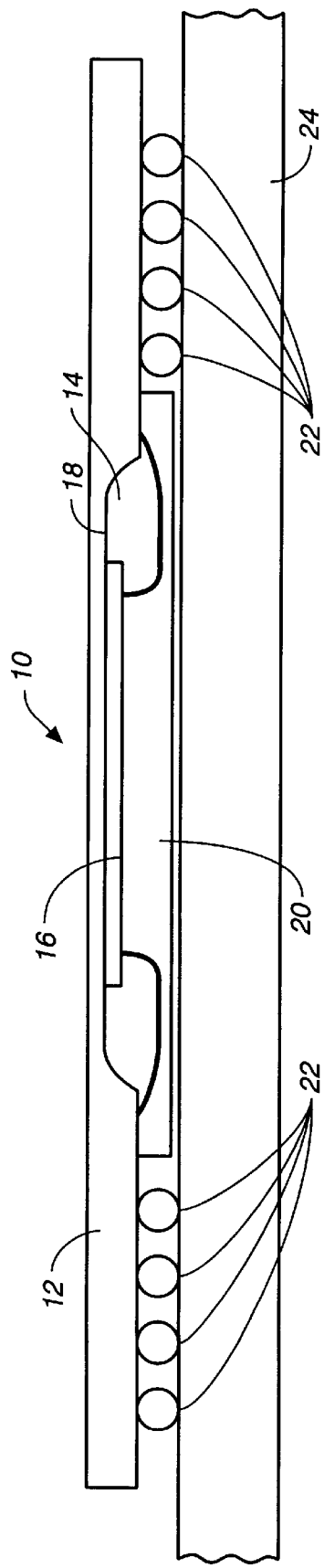
FIG._1 (PRIOR ART)
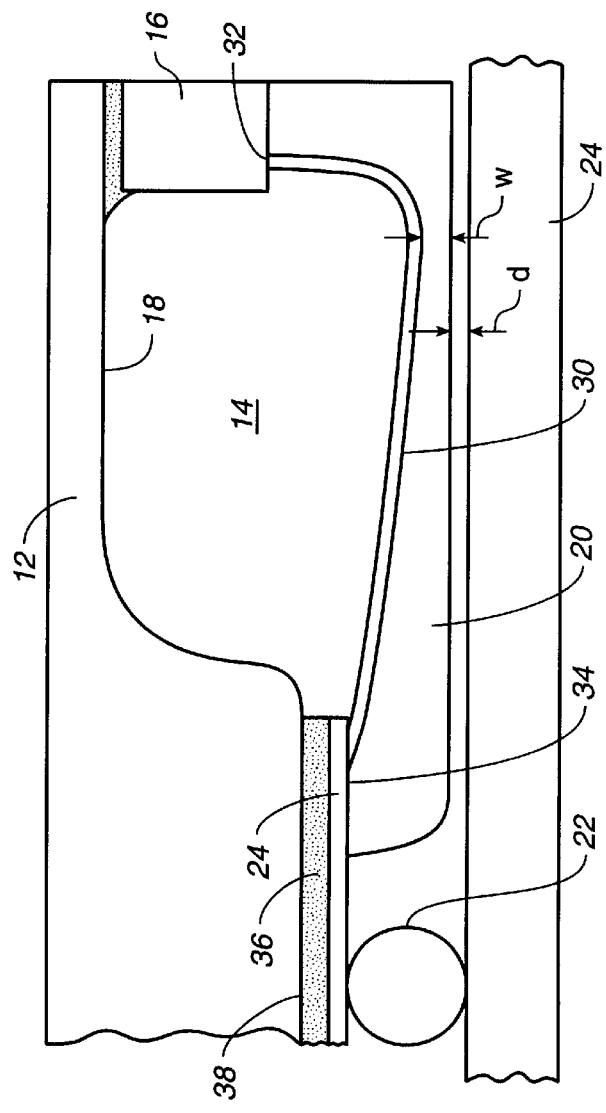
FIG._2 (PRIOR ART)

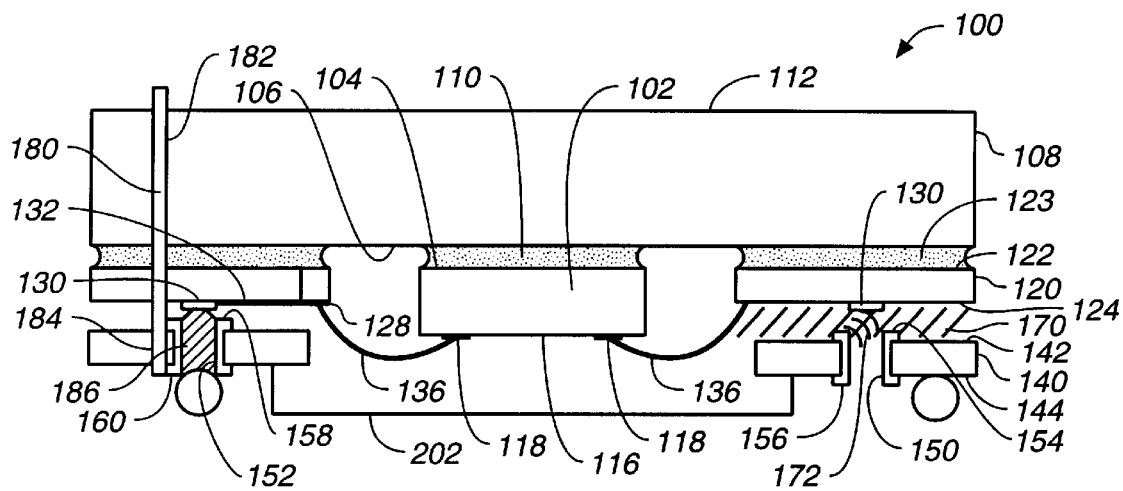
FIG._3
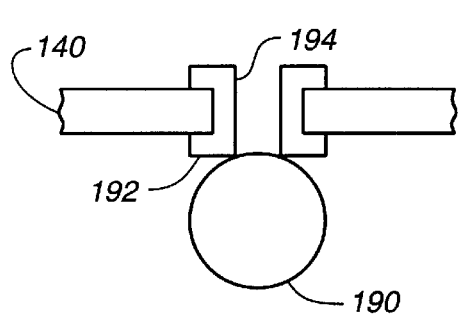
FIG._4A
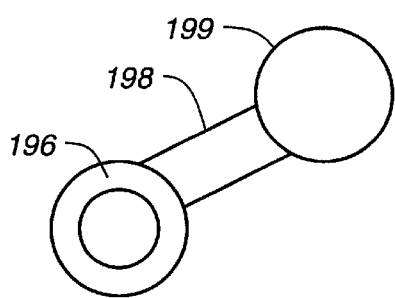
FIG._4B

BGA PACKAGE USING PCB AND TAPE IN A DIE-DOWN CONFIGURATION

BACKGROUND OF THE INVENTION

1. Field of the Invention

This invention relates to improvements in ball grid array BGA packages for integrated circuits.

2. Prior Art

FIGS. 1 and 2 illustrate a conventional die-down high performance ball grid array HBGA package 10, which includes a die-carrier/heat spreader 12 which is formed of a metallic or ceramic material. The die-carrier/heat spreader 12 has a die-cavity 14 formed through its lower surface. An integrated-circuit die 16 is attached to the top interior surface 18 of the die-carrier/heat spreader 12. A plurality of bonding wires are connected between wire bonding pad on the integrated-circuit die 16 and wire bonding sites formed on an insulated tape layer which surrounds the die-cavity 16. The wire-bonding sites on the tape layer are located outside of the cavity and adjacent to the cavity on the bottom side of the die-carrier/heat spreader 12.

An encapsulation cap 20 covers the integrated-circuit die 16 and the bonding wires. A number of solder balls, typically shown as 22, are arranged in a well-known grid pattern and are attached to the conductive traces formed on the insulated tape layer. The solder balls 22 are also connected to a number of corresponding solder-ball attachment sites located on the top surface of a printedcircuit board 24.

A number of conductive traces are formed on the insulated tape layer to connect the conductive bonding sites to selective solderable areas for the solder balls 22. The selective solderable areas are located on the insulated tape outside of the cavity and away from the encapsulation cap. The selective solderable areas for the solder balls are formed on the insulated tape layer and are arranged in a grid pattern on the bottom side of the die-down HBGA package. A solder mask is formed on the insulated tape layer but not over the selective solderable areas for the solder balls 22 on the insulated tape.

Note that thickness of the encapsulation cap 20 must be sufficiently thin and the solder balls 22 sufficiently large, so that the bottom surface of the encapsulation cap 20 provides sufficient clearance to the top surface of the printed-circuit board 24.

With reference to FIG. 2 in greater detail, the bonding wires, typically shown as 30, have one of their ends attached to bonding pads, typically shown as 32, on the lower surface of the integrated-circuit die 16. The other ends the bonding wires are attached to wire-bonding sites, typically shown as 34, which are formed on an insulated tape layer 24. The insulated tape layer 24 is attached with an adhesive layer 36 to a lower surface 38 of the die-carrier/heat spreader 12.

The encapsulation material, which forms the encapsulation cap 20, fills the cavity 14 and covers the integrated-circuit die 16, the bonding wires 30, and the wire-bonding sites 34, as illustrated. As illustrated in FIG. 2, the bonding wires 30 droop below the plane of the lower surface of the insulated tape layer 24. The encapsulation cap 20 must be thick enough to cover the drooping wire loops of the bonding wires 30 while still providing sufficient clearance to the top surface of the printed-circuit board 24.

In order to mount an HBGA package to the surface of a printed-circuit board, the grid pattern of the solder balls is placed over a corresponding grid pattern of solderable areas on the printed-circuit board. The solder balls are then heated to a temperature sufficient to melt the solder balls and to fix the HBGA package to the surface of the printed-circuit board. The solder balls provide mechanical and electrical connection between the HBGA package and the printed-circuit board.

The bonding wires 30 form wire loops. The wire loops extend between the bonding-wire pads on the integrated-circuit die, which are located in the cavity, to the bonding sites on the tape layer, which are located outside of the cavity. The bonding-wire loops also extend downwardly below the plane of the insulated tape layer on the bottom side of the die-carrier/heat sink. On the one hand, the encapsulation cap 20 must be sufficiently thick so that it completely encapsulates the downwardly extending bonding-wire loops. On the other hand, the encapsulation cap 20 must also be sufficiently thin so that sufficient clearance is provided between its bottom surface and the component-mounting surface of the printed-circuit board when the HBGA package is soldered to the printed-circuit board with the solder balls 22.

A high performance ball grid array HBGA package has a grid with a center-to-center spacing, or pitch, between adjacent solder balls of 50 mils for solder balls with a final, assembled thickness of 19 mils. A solder ball with an initial diameter of 30 mils collapses to 24–25 mils when it is mounted to a package. When the package is finally assembled to a printed-circuit board, the solder ball will have a final thickness of 19 mils. The depth of the cavity 14 in the die-carrier/heat spreader 12 is 18 mils and the combined thickness of the adhesive layer 36 and the insulated tape layer 24 is 6 mils. The droop of the bonding wires loops below the plane of the lower surface of the insulated tape layer 24 is 10 mils. The distance w between the lowest point of a bonding wire and the lower surface of the encapsulation cap is 4 mils. For a solder ball having a thickness of 19 mils, the spacing d between the lower surface of the encapsulation cap 20 and the top surface of the printed-circuit board 24 is 5 mils to provide clearance between the HBGA package and the surface of the printed-circuit board.

HBGA packages having solder-ball grid spacings smaller than 50 mils require using solder ball with final thicknesses less than 19 mils. Consequently the package configuration illustrated in FIG. 1 and FIG. 2 is limited to larger solder balls and larger grid spacings.

Consequently, it can be appreciated that the design of a die-down HBGA package requires attention to the dimensions and allowable tolerances for certain critical parameters, such as the droop of the wire loops and the thickness of the encapsulation cap. This is especially important for higher density cavity-down BGA packages with a solder-ball spacing, or pitch, which is less than 50 mils or 1.27 mm. pitches. As the diameter of the solder balls get smaller, the clearance between the package and the surface of the motherboard also get smaller.

Further, it can be appreciated that fabrication of the cavity in the die-attach/heat spreader by etching or by stamping adds additional fabrication costs and complexity to a package design.

The insulated tape layer of a conventional die-down BGA package are good for routing of conductive traces but are limited when solder ball pads are to be attached to the tapes because the conductive traces have to go around the pads which interfere with routing of the conductive traces on the insulated tape layer.

SUMMARY OF THE INVENTION

The invention provides a solution to the routing and cavity formation problems associated with conventional die-down BGA packages by combining the insulated tape layer with circuit board technology. This approach keeps costs down by eliminating the need for a cavity formed in the die-carrier/heat spreader and depends only on well-developed via technology for printed circuit boards while leaving the routing of conductive traces to tape technology.

A die-down HBGA package according to the invention includes a die-carrier/heat spreader with a substantially flat lower surface to which an integrated-circuit die is attached.

A flexible insulated tape layer has its upper surface adhesively fixed to the lower side of the die-carrier/heat spreader. A central opening in the tape layer provides clearance for the integrated-circuit die. The lower surface of the flexible insulated tape layer has a number of wire-bonding sites and a number of solder-ball contact areas formed thereon. A number of conductive traces are formed on the lower surface of the flexible insulated tape layer to connect the wire-bonding sites to respective contact areas. Bonding-wire loops are connected between wire-bonding pads on the integrated-circuit die and the wire-bonding sites on the lower surface of the flexible insulated tape layer.

A rigid board, such as an epoxy or ceramic circuit board is fixed to the lower surface of the insulated flexible tape layer. The circuit board also has a central opening which provides clearance for the integrated-circuit die and the bonding-wire loops. Electrically conductive plated-through holes are formed in the circuit board. Means are provided for connecting respective contact areas on the flexible insulated tape layer to the top surface of the plated-through holes in the circuit board. One such means includes conductive adhesive material connecting the contact areas on the tape layer with the top surfaces of the plated-through holes. Another technique use a plurality of pins which engage respective holes formed in the die-carrier/heat spreader and in the rigid circuit board.

Solder-ball pads and conductive traces on the circuit board are provided for connecting respective solder balls to the bottom surface of the plated-through holes on the bottom surface of the printed-circuit board. The solder-ball pads on the lower surface of the rigid circuit board are arranged in a well-known grid pattern on the bottom side of the die-down HBGA package.

Sealing means are provided for covering and sealing the integrated-circuit die and the bonding wires. An encapsulation layer or a separate cover covers the integrated-circuit die and the bonding wires in the die-cavity. The encapsulation layer or cover has a lower outside surface which is spaced apart from a mounting surface for the HBGA package.

Die-down HBGA packages produced according to the present invention have the advantage that no etching or stamping is required to produce a cavity in a heat spreader.

Die-down HBGA packages produced according to the present invention have the advantage that the height of the die-cavity produced according to the invention can be controlled to provide adequate clearance for drooping bonding wires.

Die-down HBGA packages produced according to the present invention have the advantage that the spacing between the encapsulation cap and the surface of a mother board can be controlled to provide adequate clearance for solder balls.

HBGA packages produced according to the present invention have the advantage that the insulated tape layer is laminated to the heat sink using standard fabrication processes.

HBGA packages produced according to the present invention have the advantage that the circuit boards have only vias and practically no etched conductors so that the circuit boards can be produced relatively inexpensively.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 is a side sectional view of a conventional encapsulated die-down high performance ball grid array HBGA package showing an integrated-circuit die in a die-cavity in a heat spreader.

FIG. 2 is an enlarged side sectional view of a portion of the conventional encapsulated die-down HBGA package of FIG. 1.

FIG. 3 is a side sectional view of an improved die-down HBGA package which uses a printed board with plated through holes according to the invention.

FIG. 4A is an enlarged side sectional view of a portion of a circuit board showing a plated-through hole to which a solder ball is directly attached.

FIG. 4B is an enlarged top view of a portion of a circuit board showing a plated through hole with an offset pad for attachment of a solder ball.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover any alternatives, modifications and equivalents, which may be included within the spirit and scope of the invention as defined by the appended claims.

FIG. 3 illustrates an enlarged portion of an improved die-down HBGA package 100 according to the invention for packaging an integrated-circuit die 102. The integrated-circuit die 102 has a pair of opposing surfaces. A top die-mounting surface 104 is fixed to the lower surface 106 of a die-carrier/heat spreader 108 with a layer 110 of die-attach material. The die-carrier/heat spreader 108 has a top, outside surface 112 and the substantially flat lower surface 106 to which the integrated-circuit die is fixed. The die-carrier/heat spreader 108 is formed of a heat conductive metallic or ceramic material.

A bottom surface 116 of the integrated-circuit die 102 has a plurality of wire-bonding pads, typically shown as 118, formed thereupon.

A flexible insulated tape layer 120 is provided with an upper surface 122 and a lower surface 124. The upper surface 122 of the flexible insulated tape layer 120 is adhesively fixed to the lower side 106 of the die-carrier/heat spreader 108 with an adhesive layer 123. The flexible insulated tape layer 120 has a central opening through which the integrated-circuit die 102 extends.

The lower surface 124 of the flexible insulated tape layer has a number of wire-bonding sites, typically shown as 128, and a number of contact areas, typically shown as 130, formed thereon. A number of conductive traces, typically shown as 132, are formed on the lower surface of the flexible insulated tape layer to connect the wire-bonding sites 128 to respective contact areas 130.

Bonding-wire loops, typically shown as 136, have one end bonded to one of the wire-bonding pads 118 formed on the integrated-circuit die 102 and the other end bonded to a respective one of the wire-bonding sites 128 on the lower surface of the flexible insulated tape layer 120.

A rigid circuit board 140 supports the insulated flexible tape layer 120. The rigid circuit board 140 has a top surface 142 and a bottom surface 144 and is formed of a material such as epoxy or ceramic. The circuit board 140 also has a central opening which provides clearance for the bonding-wire loops 136 which extend from the wire-bonding pads on the integrated-circuit die to the wire-bonding sites on the lower surface of the flexible insulated tape layer.

The rigid circuit board 140 has a plurality of electrically conductive plated-through holes, typically shown as 150, 152 formed therethrough. The plated-through holes 150 are formed by fabricating holes through the board and plating conductive material on the walls of the holes and also on the surfaces of the board adjacent to the plated-through holes. The plated-through holes 150 have conductive top surfaces, typically shown as 154, and bottom surfaces, typically shown as 156. The plated-through holes 152 have conductive top surfaces, typically shown as 158, and bottom surfaces, typically shown as 160.

FIG. 3 illustrates two techniques for connecting the rigid circuit board 140 to the flexible insulated tape layer 120 mounted to the die-carrier/heat spreader 108. One technique is illustrated in the right side of the drawing in connection with the plated-through hole 150. This technique uses an adhesive layer 170 adhesively to fix the top surface 142 of the circuit board 140 to the bottom surface 124 of the insulated tape layer 120. Respective contact areas 130 on the bottom surface of the flexible insulated layer 120 are electrically connected to the top surfaces 154 of the plated-through holes 150 using a conductive adhesive material 172 which is applied in the vicinity of the contact areas 130.

The other alternative technique is illustrated in the left side of the drawing with the plated-through hole 152. This technique provides for mechanical attachment of the circuit board 140 to the DC/HS 108 and uses a plurality of pins, typically shown as 180, the opposite ends of which are press-fit into engagement with holes, typically shown as 182, in the die-carrier/heat spreader 108 and holes, typically shown as 184, in the rigid circuit board 140. Electrical connection between the top surface 158 and bottom surface 160 of the plated-through hole 152 is made by filing the hollow center of the plated-through hole with solder or a conductive material 186.

FIGS. 4A and 4B illustrate two techniques for connecting solder balls to the bottom surface of a BGA package. FIG. 4A shows a solder ball 190 connected directly to the bottom surface 192 of a plated through hole 194 in the circuit board 140. FIG. 4B illustrates a portion of the bottom surface of a printed circuit board showing a plated through hole 196 connected through a conductive trace 198 to an offset pad 199 for attachment of a solder ball.

Referring to FIG. 3, sealing of a package is accomplished with an encapsulation layer 202 covering the integrated-circuit die and the bonding wires in the die-cavity. The encapsulation layer is, for example, an encapsulation layer or a lid, or cover, which is positioned over the integrated-circuit and the bonding wires. The encapsulation layer has a lower outside surface which is adapted to be spaced apart from a surface to which an HBGA package is mounted. The solder balls are arranged on the package in the well-known grid pattern for ball grid array packages.

A package according to the invention has the advantage that the flexible insulated tape has the conductive traces routed on its lower surface while the rigid circuit board has the plated-through holes for connecting the solder balls on the bottom side of the rigid circuit board to the contact areas on the flexible insulated tape adjacent the top side of the rigid circuit board.

The foregoing descriptions of a specific embodiment of the present invention has been presented for purposes of illustration and description. It is not intended to be exhaustive or to limit the invention to the precise forms disclosed, and obviously many modifications and variations are possible in light of the above teaching. The embodiment was chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed:

1. A die-down HBGA package for an integrated-circuit die, comprising:

an integrated-circuit die having a pair of opposing surfaces, one of which surfaces is a die-mounting surface and the other surface of which has wire-bonding pads formed thereupon;

a die-carrier/heat spreader having a top surface and having a substantially flat lower surface to which the die-mounting surface of the integrated-circuit die is attached;

a flexible insulated tape layer having an upper surface and a lower surface wherein the upper surface is adhesively fixed to the lower side of the die-carrier/heat spreader, wherein the flexible insulated tape layer has a central opening through which extends the integrated-circuit die mounted to the lower surface of the die-carrier/heat spreader, wherein the lower surface of the flexible insulated tape layer has a number of wire-bonding sites and a number of contact areas formed thereon, and wherein a number of conductive traces are formed on the lower surface of the flexible insulated tape layer to connect the wire-bonding sites to respective contact areas;

a rigid circuit board connected to the lower surface of the flexible insulated tape layer, wherein said circuit board has a central opening which provides clearance for a plurality of bonding-wire loops extending from the wire-bonding pads formed on the integrated-circuit die to the wire-bonding sites on the lower surface of the flexible insulated tape layer and wherein said rigid circuit board has a plurality of electrically conductive plated-through holes formed therethrough, each of said plated-through holes having a top surface and a bottom surface;

means for electrically connecting respective contact areas on the flexible insulated tape layer to the top surfaces of the plated-through holes formed through the rigid circuit board;

a plurality of solder balls connected to the bottom surfaces of respective plated-through holes formed in the circuit board; and sealing means for covering and sealing the integrated-circuit die and the bonding wires, said sealing means having a lower outside surface formed therein and adapted to be spaced apart from a surface to which an HBGA package is mounted.

2. The package of claim 1 wherein the means for connecting respective contact areas on the flexible insulated tape layer to the top surfaces of the plated-through holes in the circuit board includes an adhesive material for attaching the rigid circuit board to the lower surface of the flexible insulated tape layer and also includes a conductive adhesive material connecting the contact areas with the top surfaces of the plated-through holes.

3. The package of claim 1 wherein the means for connecting respective contact areas on the flexible insulated tape layer to the top surface of the plated-through holes on the circuit board includes attachment of the rigid circuit board to the die-carrier/heat spreader with a plurality of pins the ends of which are engaged in respective holes formed in the die-carrier/heat spreader and the rigid circuit board so that the respective contact areas on the flexible insulated tape layer contact the top surface of the plated through holes on the circuit board.

4. The package of claim 1 including respective solder pads for the solder balls and conductive traces which are formed on the bottom surface of the printed-circuit board and which are connected between the bottom surfaces of the plated-through holes and the respective solder pads.

5. The package of claim 1 wherein the selective solderable areas on the lower surface of the rigid circuit board are arranged in a grid pattern on the bottom side of a die-down HBGA package.

6. The package of claim 1 wherein the rigid circuit board is a printed-circuit board having the plated-through holes formed therethrough.

7. The package of claim 1 wherein the rigid circuit board is a ceramic circuit board having the plated-through holes formed therethrough.

8. The package of claim 1 wherein the sealing means includes an encapsulation layer covering the integrated-circuit die and the bonding wires in the die-cavity.

9. The package of claim 1 wherein the sealing means includes a cover which is positioned to cover the integrated-circuit and the bonding wires.

10. The package of claim 1 wherein the die-carrier/heat spreader is formed of a heat conductive material.

11. The package of claim 9 wherein the die-carrier/heat spreader is formed of a metallic material.

12. The package of claim 9 wherein the die-carrier/heat spreader is formed of a ceramic material.

13. The package of claim 1 wherein the flexible insulated tape layer is formed of a polyimide material.

14. A die-down HBGA package for an integrated-circuit die, comprising:

an integrated-circuit die having a pair of opposing surfaces, one of which surfaces is a die-mounting surface and the other surface of which has wire-bonding pads formed thereupon;

a die-carrier/heat spreader having a top surface and having a substantially flat lower surface to which the die-mounting surface of the integrated-circuit die is attached;

a flexible insulated tape layer having an upper surface and a lower surface wherein the upper surface is adhesively fixed to the lower side of the die-carrier/heat spreader, wherein the flexible insulated tape layer has a central opening through which extends the integrated-circuit die mounted to the lower surface of the die-carrier/heat spreader, wherein the lower surface of the flexible insulated tape layer has a number of wire-bonding sites and a number of contact areas formed thereon, and wherein a number of conductive traces are formed on the lower surface of the flexible insulated tape layer to connect the wire-bonding sites to respective contact areas;

a rigid circuit board connected to the lower surface of the flexible insulated tape layer, wherein said circuit board has a central opening which provides clearance for a plurality of bonding-wire loops extending from the wire-bonding pads formed on the integrated-circuit die to the wire-bonding sites on the lower surface of the flexible insulated tape layer and wherein said rigid circuit board has a plurality of electrically conductive plated-through holes formed therethrough, each of said plated-through holes having a top surface and a bottom surface;

means for electrically connecting respective contact areas on the flexible insulated tape layer to the top surfaces of the plated-through holes formed through the rigid circuit board including an adhesive material for attaching the rigid circuit board to the lower surface of the flexible insulated tape layer and also including a conductive adhesive material for connecting the contact areas with the top surfaces of the plated-through holes;

a plurality of solder balls connected to the bottom surfaces of respective plated-through holes formed in the circuit board; and sealing means for covering and sealing the integrated-circuit die and the bonding wires, said sealing means having a lower outside surface formed therein and adapted to be spaced apart from a surface to which an HBGA package is mounted.

15. A die-down HBGA package for an integrated-circuit die, comprising:

an integrated-circuit die having a pair of opposing surfaces, one of which surfaces is a die-mounting surface and the other surface of which has wire-bonding pads formed thereupon;

a die-carrier/heat spreader having a top surface and having a substantially flat lower surface to which the die-mounting surface of the integrated-circuit die is attached;

a flexible insulated tape layer having an upper surface and a lower surface wherein the upper surface is adhesively fixed to the lower side of the die-carrier/heat spreader, wherein the flexible insulated tape layer has a central opening through which extends the integrated-circuit die mounted to the lower surface of the die-carrier/heat spreader, wherein the lower surface of the flexible insulated tape layer has a number of wire-bonding sites and a number of contact areas formed thereon, and wherein a number of conductive traces are formed on the lower surface of the flexible insulated tape layer to connect the wire-bonding sites to respective contact areas;

a rigid circuit board connected to the lower surface of the flexible insulated tape layer, wherein said circuit board has a central opening which provides clearance for a plurality of bonding-wire loops extending from the wire-bonding pads formed on the integrated-circuit die to the wire-bonding sites on the lower surface of the flexible insulated tape layer and wherein said rigid circuit board has a plurality of electrically conductive plated-through holes formed therethrough, each of said plated-through holes having a top surface and a bottom surface;

means for electrically connecting respective contact areas on the flexible insulated tape layer to the top surfaces of the plated-through holes formed through the rigid circuit board including a plurality of pins the ends of which are engaged in respective holes formed in the die-carrier/heat spreader and the rigid circuit board for attachment of the rigid circuit board to the die-carrier/heat spreader so that the respective contact areas on the flexible insulated tape layer contact the top surface of the plated through holes on the circuit board;

a plurality of solder balls connected to the bottom surfaces of respective plated-through holes formed in the circuit board; and sealing means for covering and sealing the integrated-circuit die and the bonding wires, said sealing means having a lower outside surface formed therein and adapted to be spaced apart from a surface to which an HBGA package is mounted.

16. A method of packaging an integrated circuit die in a die-down HBGA package, comprising the steps of:

attaching an integrated-circuit die having a pair of opposing surfaces, including a die-mounting surface and the other surface having wire-bonding pads formed thereupon, to a die-carrier/heat spreader having a top surface and having a substantially flat lower surface to which the die-mounting surface of the integrated-circuit die is attached;

adhesively fixing an upper surface of a flexible insulated tape layer to the lower side of a die-carrier/heat spreader while providing the flexible insulated tape layer with a central opening through which extends the integrated-circuit die mounted to the lower surface of the die-carrier/heat spreader, wherein the lower surface of the flexible insulated tape layer has a number of wire-bonding sites and a number of contact areas formed thereon and wherein a number of conductive traces are formed on the lower surface of the flexible insulated tape layer to connect the wire-bonding sites to respective contact areas;

electrically connecting respective contact areas on the flexible insulated tape layer to the top surfaces of plated-through holes formed through a rigid circuit board connected to the lower surface of the flexible insulated tape layer, wherein the circuit board has a central opening which provides clearance for a plurality of bonding-wire loops extending from the wire-bonding pads formed on the integrated-circuit die to the wire-bonding sites on the lower surface of the flexible insulated tape layer;

connecting a plurality of solder balls to the bottom surfaces of respective plated-through holes formed in the circuit board; and covering and sealing the integrated-circuit die and the bonding wires to form a cap with a lower outside surface adapted to being spaced apart from a surface to which the HBGA package is mounted.

17. The method of claim 16 wherein the step of electrically connecting respective contact areas on the flexible insulated tape layer to the top surfaces of the plated-through holes in the circuit board includes attaching the rigid circuit board to the lower surface of the flexible insulated tape layer with an adhesive material and also includes electrically connecting the contact areas with the top surfaces of the plated-through holes with a conductive adhesive material.

18. The method of claim 16 wherein the step of electrically connecting respective contact areas on the flexible insulated tape layer to the top surfaces of the plated-through holes in the circuit board includes attaching of the rigid circuit board to the die-carrier/heat spreader with a plurality of pins, the ends of which are engaged in respective holes formed in the die-carrier/heat spreader and the rigid circuit board, so that the respective contact areas on the flexible insulated tape layer are contacting the top surfaces of the plated through holes on the circuit board.

* * * * *